(12) United States Patent
Brunot (10) Patent No.: US 7,533,211 B2
(45) Date of Patent: May 12, 2009

(54) CROSS-BAR SWITCHING IN AN EMULATION ENVIRONMENT

(76) Inventor: Grégoire Brunot, Mentor Graphics Corporation, Meta Systems Division, 3 Avenue du Canada, Batiment Sigma, 91975 Courtaboeuf Cedex (FR)

( * ) Notice: Subject to any disclaimer, the term of this patent is extended or adjusted under 35 U.S.C. 154(b) by 61 days.

(21) Appl. No.: 11/517,194

(22) Filed: Sep. 5, 2006

(65) Prior Publication Data

US 2007/0198242 A1 Aug. 23, 2007

Related U.S. Application Data

(63) Continuation of application No. PCT/EP2006/060232, filed on Feb. 23, 2006.

(51) Int. Cl.
*G06F 13/00* (2006.01)
*G06F 9/44* (2006.01)

(52) U.S. Cl. .............................. 710/317; 703/23; 703/25

(58) Field of Classification Search ................. 710/317; 703/23–28
See application file for complete search history.

(56) References Cited

U.S. PATENT DOCUMENTS

| | | | | |
|---|---|---|---|---|
| 4,639,919 A | * | 1/1987 | Chang et al. ................. | 714/743 |
| 5,151,903 A | * | 9/1992 | Mydill et al. ................ | 714/743 |
| 5,189,665 A | * | 2/1993 | Niehaus et al. .............. | 370/248 |
| 5,402,427 A | * | 3/1995 | Parker ......................... | 714/744 |
| 5,410,300 A | * | 4/1995 | Gould et al. ................. | 340/2.2 |
| 5,412,296 A | * | 5/1995 | Chien et al. .................. | 318/444 |
| 5,530,813 A | | 6/1996 | Paulsen et al. | |
| 5,612,891 A | * | 3/1997 | Butts et al. .................... | 716/16 |
| 5,838,684 A | * | 11/1998 | Wicki et al. ................. | 370/416 |
| 5,960,191 A | * | 9/1999 | Sample et al. ................ | 703/28 |
| 6,028,463 A | * | 2/2000 | Albu et al. ................... | 327/291 |
| 6,208,667 B1 | | 3/2001 | Caldara et al. | |
| 6,785,873 B1 | * | 8/2004 | Tseng ............................ | 716/4 |
| 7,098,688 B2 | * | 8/2006 | Reblewski et al. ............ | 326/41 |
| 7,193,994 B1 | * | 3/2007 | Payson ........................ | 370/380 |
| 7,239,669 B2 | * | 7/2007 | Cummings et al. .......... | 375/295 |
| 2002/0156614 A1 | | 10/2002 | Goode | |
| 2003/0139917 A1 | * | 7/2003 | Hardwick et al. ............. | 703/21 |

(Continued)

OTHER PUBLICATIONS

International Search Report and Written Opinion for PCT/EP2006/060232, filed Feb. 2, 2006.

*Primary Examiner*—Glenn A Auve
*Assistant Examiner*—Nimesh G Patel
(74) *Attorney, Agent, or Firm*—Klarquist Sparkman, LLP (57) ABSTRACT

A system and method are disclosed for crossbar switching in an emulation environment. The switch is designed to coordinate scheduling between different crossbars in the system and to be dynamically reconfigurable during operation. In one aspect, a crossbar switch includes a switching matrix and an array of control cells. The control cells use a high-frequency clock to perform high-speed switching and a low-frequency clock in order to initiate a switching sequence. The low-frequency clock initiates the sequence at a time coordinated with other crossbars in the system to optimize scheduling. In another aspect, the control cells include a memory containing control bits for the switching matrix. The memory may be reconfigured without stopping traffic management through the crossbar switch. In yet another aspect, the high-frequency sequence may provide for the ability to loop. In still another aspect, the crossbar switches may receive multiplexed input signals that can be routed to several crossbar outputs without the need for an internal demultiplexing stage.

21 Claims, 9 Drawing Sheets

U.S. PATENT DOCUMENTS

2004/0001487 A1    1/2004  Tucker et al.
2004/0075469 A1*   4/2004  Reblewski et al. ............ 326/93
2005/0268265 A1*  12/2005  Ly et al. ........................ 716/6
2006/0190904 A1*   8/2006  Haji-Aghajani et al. ....... 716/17
2007/0106833 A1*   5/2007  Rankin et al. ............... 710/317

* cited by examiner

CROSS-BAR SWITCHING IN AN EMULATION ENVIRONMENT

CROSS-REFERENCE TO RELATED APPLICATION

This application is a continuation of copending International Patent Application No. PCT/EP2006/060232, filed on Feb. 23, 2006. This prior application is incorporated by reference herein.

FIELD OF THE INVENTION

The present invention generally relates to hardware emulators, and more particularly to the use of cross-bar switches in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Emulators contain a network of crossbar switches to facilitate communication between the different emulator components. A crossbar switch is an interconnect device that receives multiple inputs and maps the inputs to any of its desired outputs. For example, a 32×32 crossbar switch may be programmed to connect any of its 32 inputs to any of its 32 outputs.

Traditional crossbar switches have scheduling problems, particularly for such switches having multiplexed outputs. Multiplexed output signals are desirable because they save resources, such as by decreasing the number of wires etc. But scheduling with multiplexed output signals creates difficulties because of the need for coordination between the crossbar switch and other resources. For example, without some kind of coordination, it may happen that two different signals need to be routed to the same output at the same time.

Thus, it is desirable to provide a crossbar switch with reduced scheduling problems.

SUMMARY

Described below is a system and method for crossbar switching in an emulation environment. The switch is designed to coordinate scheduling between different crossbars in the system.

In one aspect, a crossbar switch includes a switching matrix and an array of control cells. The control cells use a high-frequency clock to perform high-speed switching and a low-frequency clock in order to initiate a high-frequency switching sequence. The low-frequency clock solves the scheduling problem by coordinating the timing of the switch at the transaction level, while the high-frequency clock allows for the speed of switching, particularly useful for creating multiplexed outputs.

In another aspect, the control cells include a memory containing control bits for the switching matrix. The memory may be reconfigured without stopping traffic management through the crossbar switch.

In yet another aspect, the high-frequency sequence may provide for the ability to loop. For example, start- and end-loop addresses can be provided and monitored by a sequence controller to implement the loops.

In still another aspect, the crossbar switches may receive multiplexed input signals that can be routed to several crossbar outputs without the need for an internal demultiplexing stage.

These features and others of the described embodiments will be more readily apparent from the following detailed description, which proceeds with reference to the accompanying drawings.

DETAILED DESCRIPTION

Figure 1:
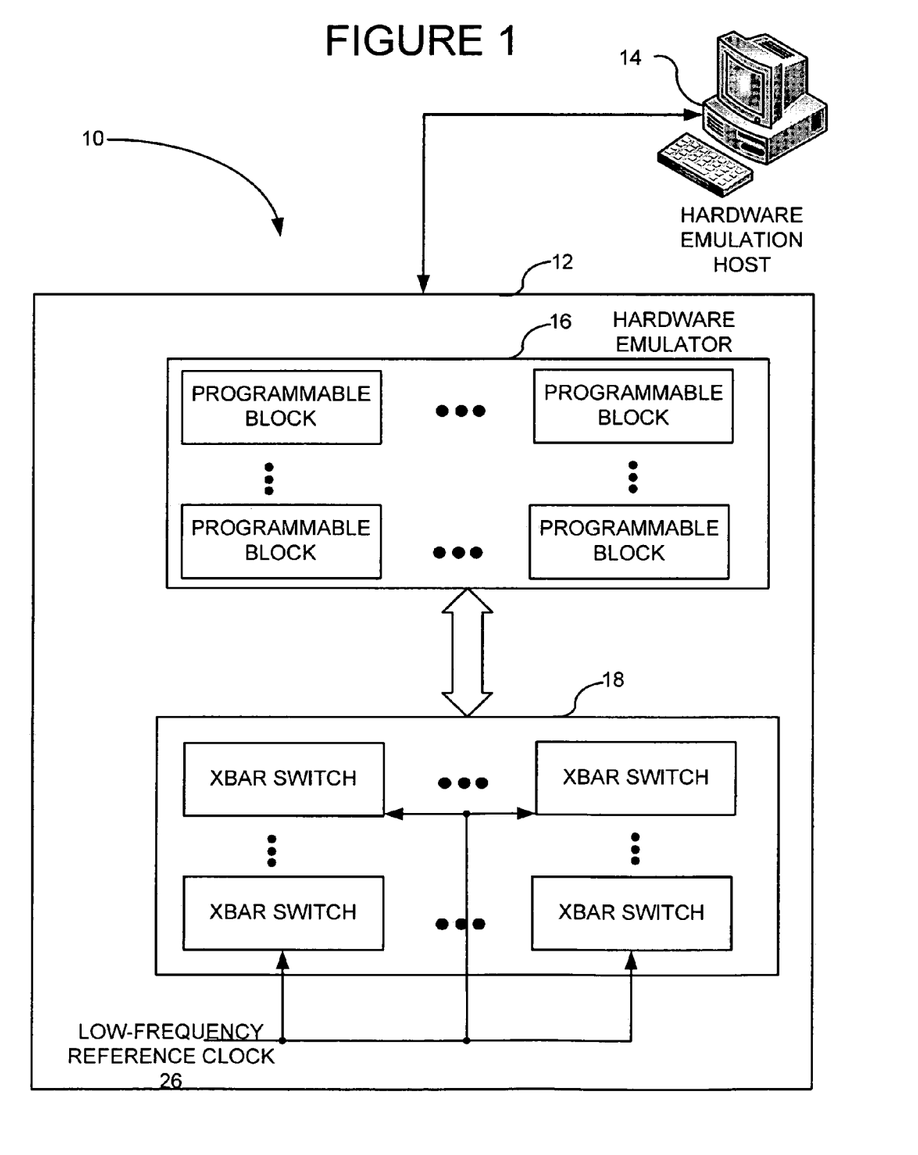
FIG. 1 is a system diagram of a hardware emulator environment including an array of dynamic crossbar switches according to the invention.

FIG. 1 shows an emulator environment 10 including a hardware emulator 12 coupled to a hardware emulator host 14. The emulator host 14 may be any desired type of computer hardware and generally includes a user interface through which a user can load, compile and download a design to the emulator 12.

The emulator 12 includes an array of programmable logic blocks 16 programmed with the user's design downloaded from the emulator host 14. The programmable logic blocks 16 are generally programmable integrated circuits, such as FPGAs. The programmable logic blocks 16 may be located on one or more printed circuit boards (not shown).

The emulator 12 also includes an array of crossbar switches 18. The crossbar switches allow for interconnection of the programmable logic blocks 16. In order to coordinate scheduling between crossbar switches, a low-frequency clock 26 is distributed to multiple crossbar switches in the system. The low-frequency clock 26 initiates a switching sequence in the crossbar switches at the proper time to ensure optimal scheduling between crossbar switches.

Figure 2:
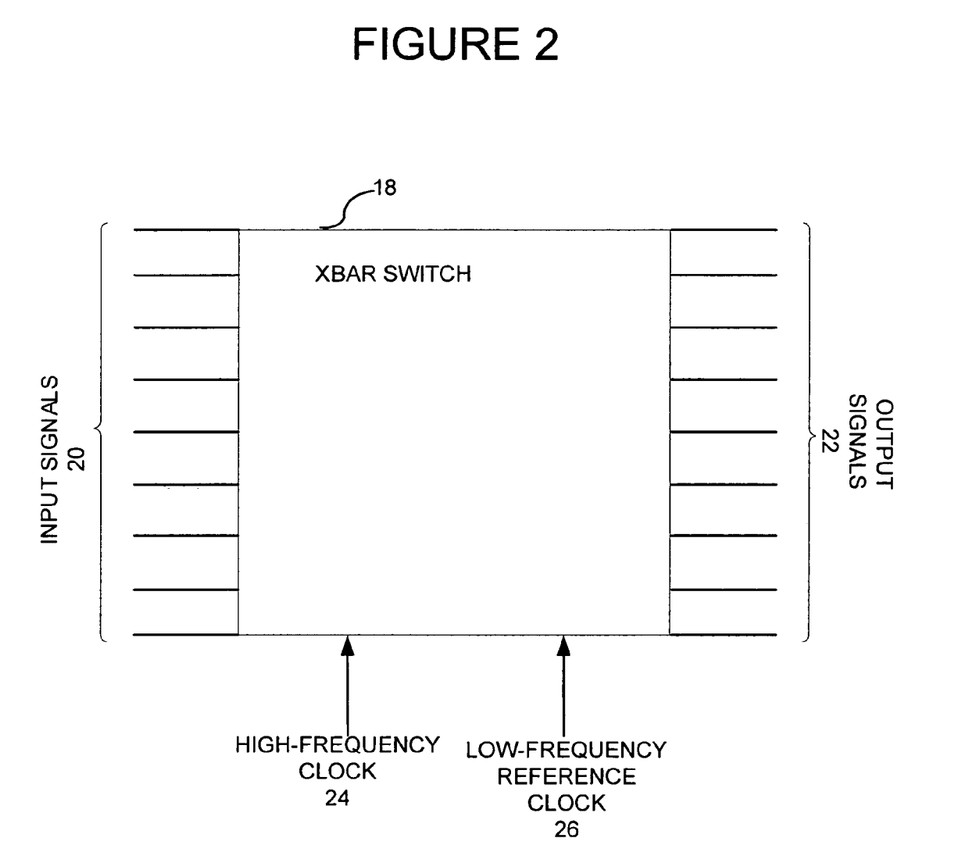
FIG. 2 is a hardware diagram providing further details of a crossbar switch of FIG. 1.

FIG. 2 shows an example of a crossbar switch 18. Normally a crossbar switch has an equal number of inputs 20 and outputs 22. Thus, the illustrated crossbar switch is an N×N switch, where N is any number. The crossbar switch 18 also receives a high-frequency clock 24 and the low-frequency clock 26. Any desired frequencies may be used, but example frequencies can be 100-200 MHz for the high frequency clock and 1-5 MHz for the low-frequency clock. Additionally, the clocks may be synchronous or asynchronous. The high-frequency clock is used for switching and the low-frequency clock is used to optimize when a high-frequency sequence should be initiated.

Figure 3:
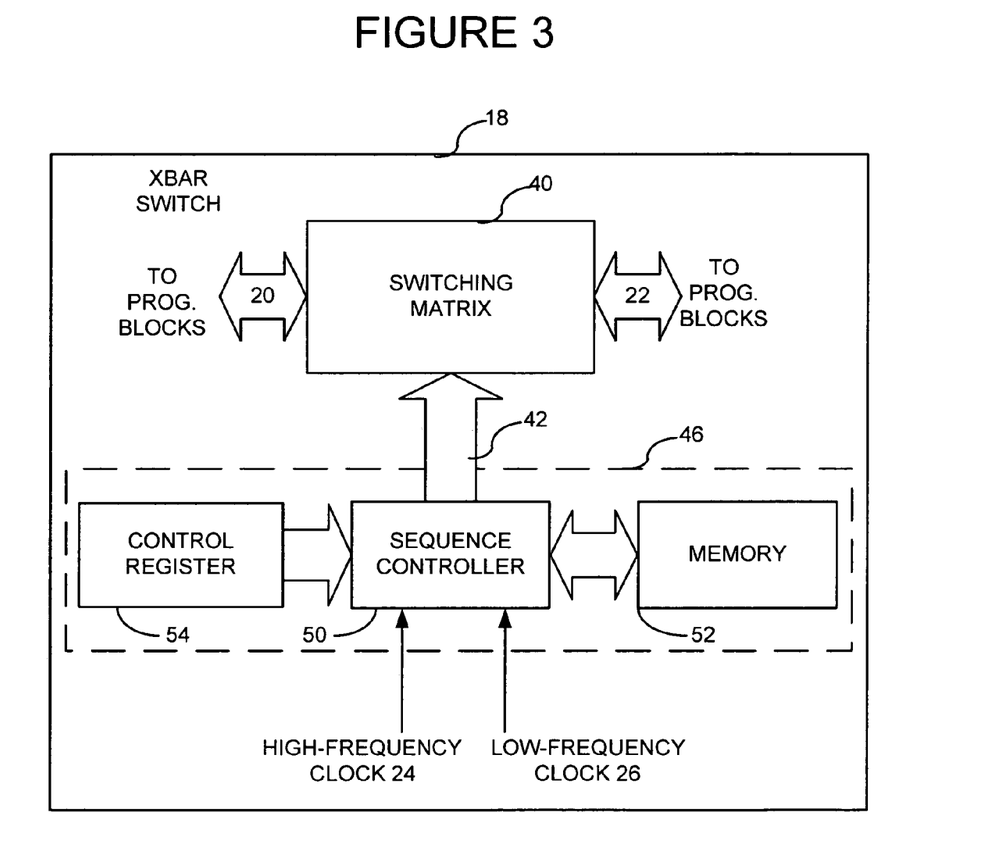
FIG. 3 is a detailed hardware diagram showing an embodiment of the crossbar switch of FIG. 2.

FIG. 3 shows more detail of the crossbar switch 18 of FIG. 2. A switching matrix receives inputs 20 and passes the inputs through to the proper outputs 22 according to control lines 42 from a control cell 46. The control cell 46 receives the high-frequency clock 24 and low-frequency clock 26 and uses these clocks in the generation of the signals on the control lines 42. The high- and low-frequency clocks are input into a sequence controller 50 within the control cell 46 that reads a memory 52 in order to obtain the necessary control signals for the control lines 42. The memory 52 can be any type of desired memory, such as RAM, ROM, etc. The sequence controller 50 includes a counter that steps through a predetermined sequence of reading memory addresses. However, the sequence can be modified in correspondence with control signals provided to the sequence controller 50 through a control register 54.

Figure 4:
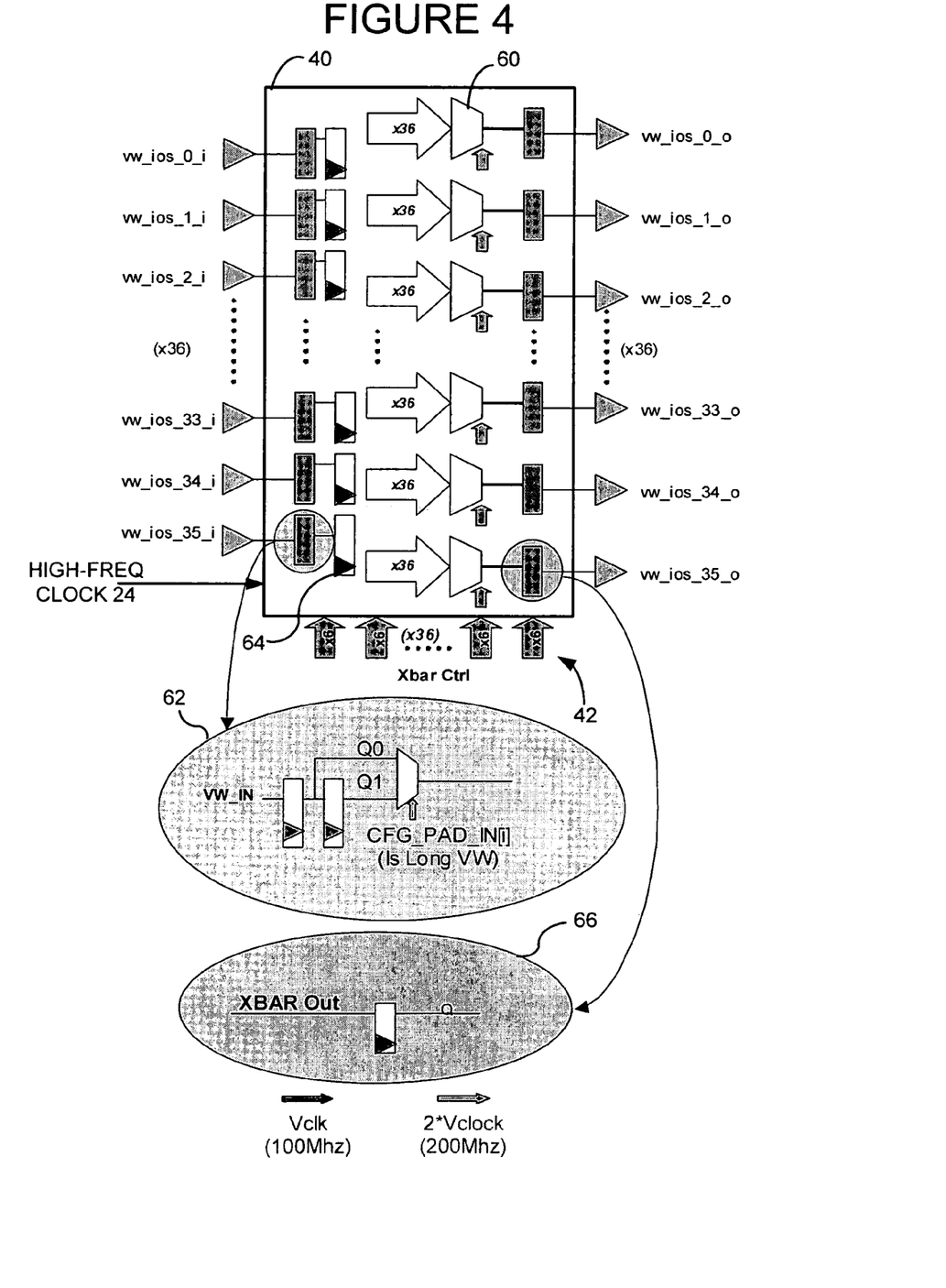
FIG. 4 is a detailed hardware diagram of an example switching matrix within a crossbar switch.

FIG. 4 shows a particular example of a switching matrix 40 used in an actual design. Of course, there are many ways to design the switching matrix and the invention should not be considered limited to this very particular design. The switching matrix 40 is a 36×36 switch that receives control lines 42 in thirty-six sets of six lines each. The switching matrix 40 includes multiplexers 60, which are thirty-six in number: one for each output. Each multiplexer 60 receives all thirty-six inputs, any of which can be switched onto its respective output. Each multiplexer also receives one of the sets of control lines 42 so that each set of control lines 42 controls one multiplexer in the switching matrix 40. The registers and circuitry shown at 62, 64, and 66 are pipeline stages used to synchronize the crossbar switch with other circuits and are not of importance to the invention.

Figure 5:
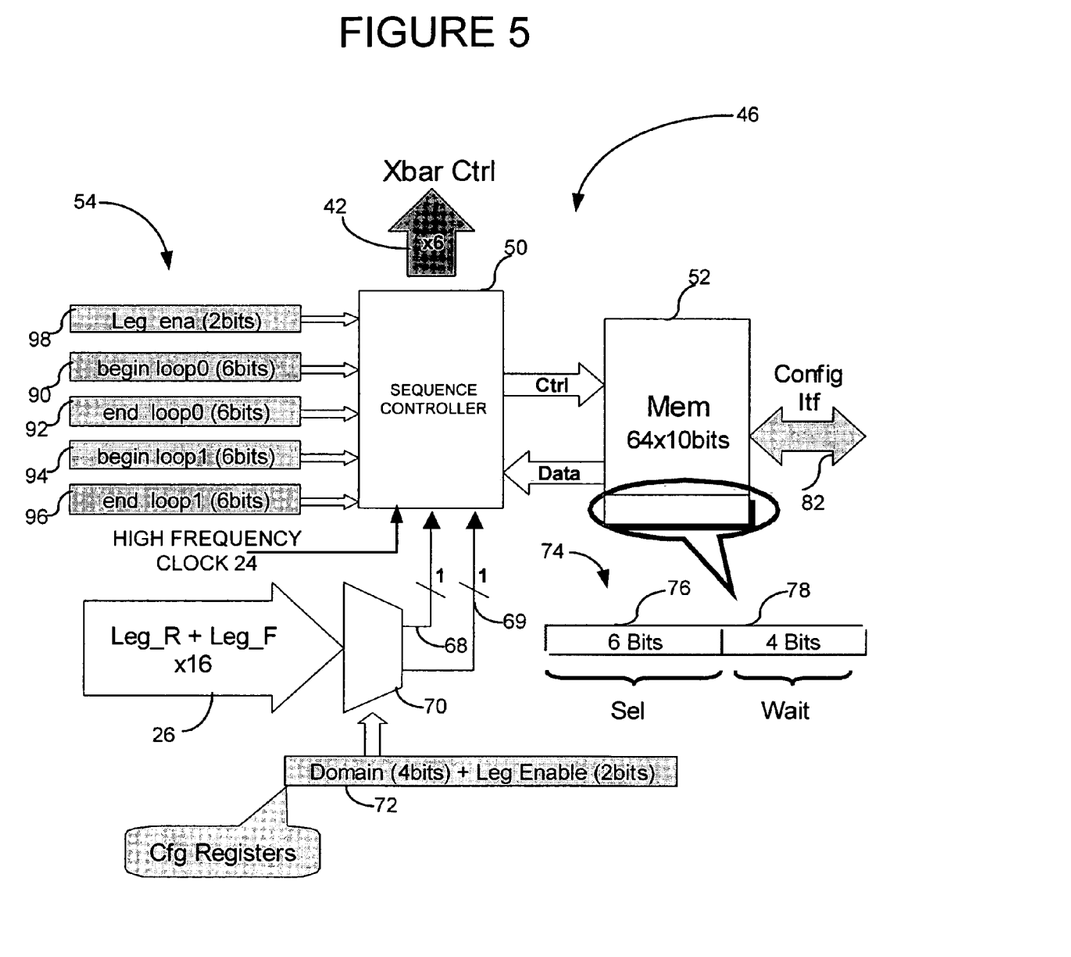
FIG. 5 is a detailed hardware diagram of a control cell circuit.

FIG. 5 shows one example of a control cell 46 used to generate six control lines 42 to the switching matrix of FIG. 4. Again, this is a very particular embodiment of a control cell and can easily be modified based on the design. Sixteen low-frequency clock lines 26 enter the control cell 46, and one of the sixteen is selected in multiplexer 70 by data contained in register 72. The low-frequency clocks in this case are simply periodic edge detections of a rising edge and a falling edge, which are separately provided on multiplexer outputs 68, 69. Register 72 contains domain bits that select one of sixteen clocks and leg enable bits that select a rising edge, falling edge, or both of the selected clock. Thus, through the leg-enable field, one of the lines 68, 69 may be suppressed. The memory 52 is a 64×10 bit memory and each memory address contains two fields of data shown at 74, including select bits 76 and wait bits 78. The select bits 76 correspond to the six control lines 42 and are used to select one of the thirty-six lines entering the multiplexers 60 (FIG. 4). The wait bits 78 are used to hold the sequence controller 50 in the same state for the designated number of cycles. For example, the wait bits may be a value of ten meaning to wait in the current state for ten high-frequency cycles and then continue. The memory 52 is a dual-port RAM memory and has a configuration port coupled to configuration lines 82 that allow the memory to be reconfigured without stopping the crossbar switch. For example, the memory can be written from the hardware emulation host 14 (FIG. 1) while the switch 18 is still actively switching. In this way, the crossbar switch 18 is dynamically configurable. The sequence controller 50 starts at address 00, reads the select bits 76 from the memory 52 and outputs the these bits on control lines 42. At the next clock cycle of high-frequency clock 24, the sequence controller 50 reads address 01, etc. At the same time, the sequence controller 50 monitors certain information from the control register 54. For example, the registers 90 and 92 contain start and end loop addresses. When the sequence controller 50 reaches the address corresponding to the end loop address stored in register 92, the sequence controller uses the address stored in the begin loop register 90 to access the memory. Thus, the program counter within the sequence controller is changed to the start of the loop. The sequence controller 50 then continues to loop on the addresses provided until a rising or falling edge of the low-frequency reference clock 26 when the sequence controller exits the loop. A second loop address is provided by registers 94 and 96. The leg_ena register 98 is used to enable or disable detection by the sequence controller 50 of a rising or falling edge of the low-frequency clock. The registers 72, 90, 92, 94, 96 and 98 are dynamically configurable, meaning that they can be changed during operation of the switch.

Figure 6:
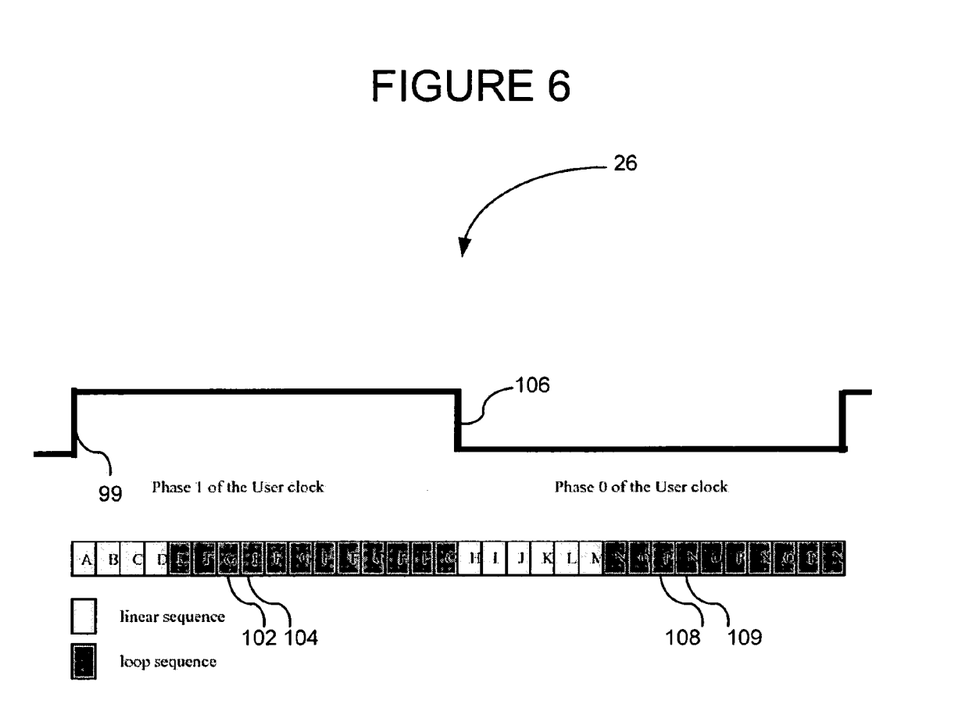
FIG. 6 shows an example timing diagram using a crossbar switch according to the invention.

FIG. 6 provides a specific example of the sequence controller 50 stepping through a sequence at high frequency. In this example, register 94 contains address E and register 96 contains address G. The sequence controller starts at address A as a result of the rising edge 99 of the low-frequency clock 99. At every rising clock edge of the high-frequency clock, the sequence continues with the next memory address in a linear sequence until address G is encountered as shown at 102. At that time, the sequence controller loops back to address E as shown at 104 until the falling edge 106 of the clock, at which time the sequence controller exits the loop and continues a linear sequence. At address P, shown at 108, the sequence controller 50 detects through a comparison of the current program counter address and register 92 that an end of the loop has been reached. Thus, the sequence controller jumps back to address N (see 109), which is the address stored in register 90. This loop continues until the next clock edge of the low-frequency clock when a new sequence is initiated. In this particular example, the inputs are multiplexed so that during the same clock cycle multiple time slots of data are switched.

Figure 7:
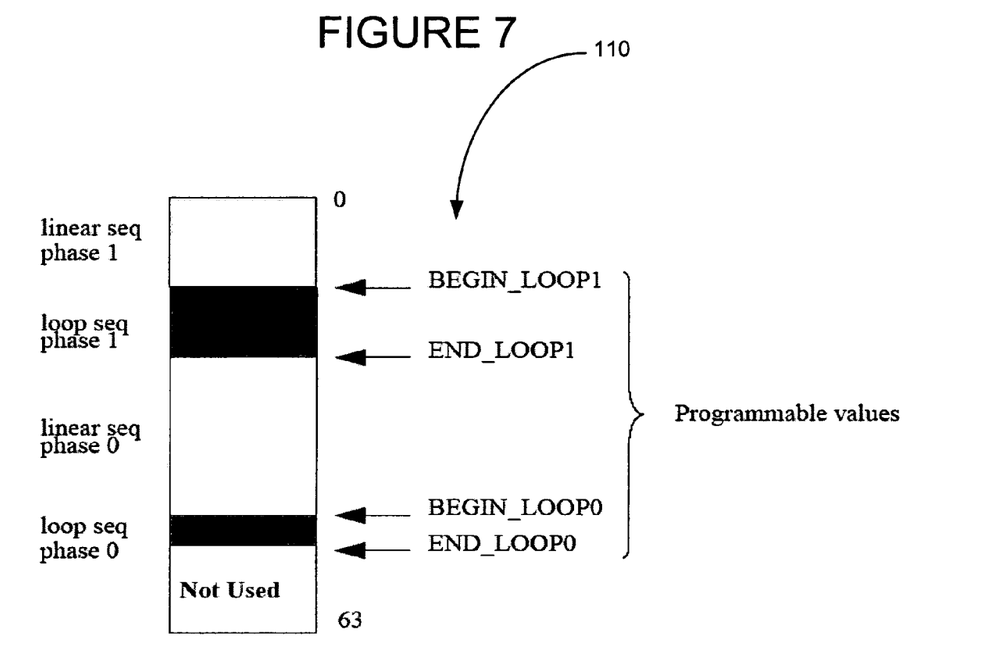
FIG. 7 shows an example of looping sequences using the control cell circuit of FIG. 5.

FIG. 7 shows the memory map for memory 52 in terms of the loops and sequential addresses. As indicated at 110, the registers 90, 92, 94, and 96 are programmable and can be modified dynamically during operation of the switch.

Figure 8:
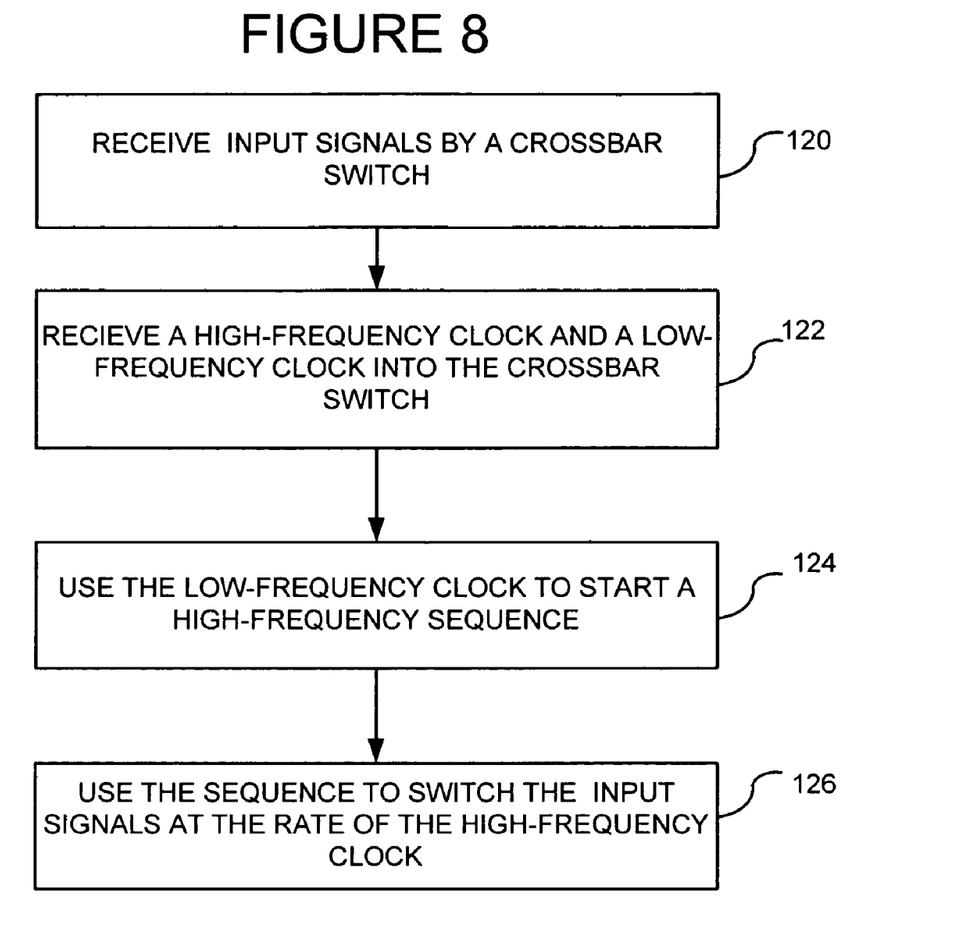
FIG. 8 is a flowchart of a method for switching a crossbar switch using high- and low-frequency clocks.

FIG. 8 shows a method for using the crossbar switch 18. In process block 120, input signals are received by the crossbar switch. In process block 122, a high-frequency clock signal and a low-frequency clock signal are received by the crossbar switch. In process block 124, the low-frequency clock is used to start a high-frequency sequence. For example, FIG. 6 shows that a high-frequency sequence is initiated based on an edge of the low-frequency clock signal at 99. In process block 126, the sequence initiated by the low-frequency clock is used to switch signals at high frequency.

Figure 9:
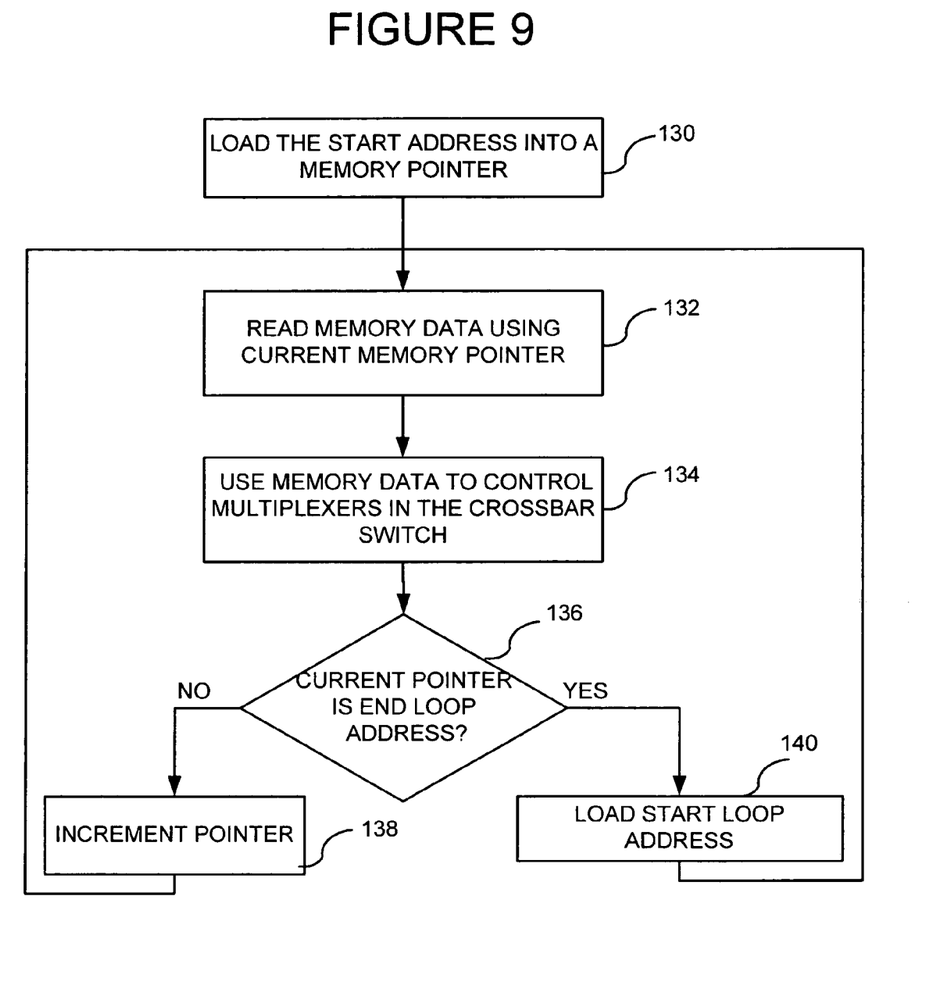
FIG. 9 is a detailed flowchart of a method for switching a crossbar switch using a memory.

FIG. 9 shows a method used by the sequence controller 50. As shown in process block 130, at one of the edges of the low-frequency clock, a starting memory address is loaded into a memory pointer, such as a program counter of the sequence controller. In process block 132, the sequence controller reads the memory using the address in the memory pointer. In process block 134, at least part of the memory data (select field 76) is placed on control lines 42 to control the multiplexers 60 within the switching matrix 40. In decision block 136, a check is made to see whether the current pointer is equal to one of the control registers (either 92 or 96, depending on the phase). If yes, then in process block 140, an address is loaded into the memory pointer from the control register 54, such as either from registers 90 or 94. If no, then the pointer is incremented in process block 138.

Having illustrated and described the principles of the illustrated embodiments, it will be apparent to those skilled in the art that the embodiments can be modified in arrangement and detail without departing from such principles.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

I claim:

1. A method of switching to route input signals to desired outputs of a crossbar switch in a hardware emulator, comprising:
   receiving, in the crossbar switch, a high-frequency clock signal and a low-frequency clock signal;
   initiating a switching sequence in response to the low-frequency clock signal; and
   switching the input signals using the high-frequency clock signal in accordance with the switching sequence, wherein the switching sequence includes at least one loop that continues until an edge of the low-frequency clock.

2. The method of claim 1, wherein initiating a switching sequence includes loading a memory address into a sequence controller within the crossbar switch.

3. The method of claim 2, further including loading contents of the memory address into the sequence controller and using the memory contents as control signals to a switching matrix within the crossbar switch.

4. The method of claim 1, further including coordinating scheduling of multiple crossbar switches in the hardware emulator using the low-frequency clock.

5. The method of claim 1, wherein the switching sequence includes incrementing a memory pointer and monitoring an end loop address and if the pointer equals the end loop address, changing the memory pointer to a start-loop address.

6. The method of claim 1, wherein the high-frequency clock is between 100-200 MHz and the low-frequency clock is between 1-5 MHz.

7. The method of claim 1, further including dynamically changing a configuration of the crossbar switch by loading a memory within the crossbar switch while the switch is switching.

8. The method of claim 1, further including reading a wait state within the crossbar switch and delaying the switching sequence for a number of cycles corresponding to the wait state.

9. The method of claim 1, wherein the input signals are multiplexed signals with time slices corresponding to a phase of the high-frequency signal.

10. The method of claim 1, further including reading a register within the crossbar switch that controls disabling edge detection for a desired edge of the low-frequency clock signal.

11. The method of claim 1, further including monitoring loop control registers within the crossbar switch and dynamically updating the loop control registers while the crossbar switch is actively switching.

12. A crossbar switch in a hardware emulator, comprising:
   an input port adapted to receive input signals to the crossbar switch;
   an output port adapted to output signals from the crossbar switch;
   a switching matrix coupled between the input port and output port of the crossbar switch; and
   a sequence controller coupled to the switching matrix and having a high-frequency clock input port, which is designed to receive a high-frequency clock for switching the input signals in accordance with a switching sequence, and a low-frequency clock input port, which is designed to receive a low-frequency clock for initiating the switching sequence and for looping the switching sequence until an edge of the low-frequency clock.

13. The crossbar switch of claim 12, further including a memory coupled to the sequence controller.

14. The crossbar switch of claim 13, wherein each memory location includes a control field that defines select signals to the switching matrix.

15. The crossbar switch of claim 12, further including loop control registers coupled to the sequence controller.

16. The crossbar switch of claim 12, further including an edge-detection register coupled to the sequence controller and that defines whether detection of an edge of the low-frequency reference clock should be enabled or disabled.

17. The crossbar switch of claim 12, wherein the crossbar switch is an N×N crossbar switch, where N corresponds to the number of inputs and outputs and the switching matrix includes N, N-input multiplexers and wherein the crossbar switch includes N sequence controllers.

18. The crossbar switch of claim 12, wherein the low-frequency clock is coupled to multiple crossbar switches in the hardware emulator to coordinate scheduling there between.

19. A crossbar switch in a hardware emulator, comprising:
means for initiating a high-frequency switching sequence using a low-frequency clock signal, for looping on the switching sequence and for terminating the switching sequence based on an edge of the low-frequency clock; and
means for switching the crossbar switch at high frequency in accordance with the switching sequence using a high-frequency clock.

20. The crossbar switch of claim 18, further including means for dynamically reconfiguring the crossbar switch while switching.

21. A crossbar switch in a hardware emulator, comprising:
an input port adapted to receive input signals to the crossbar switch;
an output port adapted to output signals from the crossbar switch;
a switching matrix coupled between the input port and output port of the crossbar switch;
a sequence controller coupled to the switching matrix for controlling the switching of the switching matrix, the sequence controller having a high-frequency clock input port, which is designed to receive a high-frequency clock for switching the input signals in accordance with a switching sequence and a low-frequency clock input port, which is designed to receive a low-frequency clock for initiating the switching sequence;
a memory coupled to the sequence controller, wherein each memory location includes a control field that defines select signals to the switching matrix; and
loop control registers coupled to the sequence controller for controlling the sequence controller, the sequence controller for causing the switching sequence to loop in response to the loop control registers and looping until an edge of the low-frequency clock.

* * * * *